(12) United States Patent
Patil et al.

(10) Patent No.: US 10,422,172 B2
(45) Date of Patent: Sep. 24, 2019

(54) TOOL-LESS HINGE MECHANISM

(71) Applicant: Appleton Grp LLC, Rosemont, IL (US)

(72) Inventors: Santosh K. Patil, Pune (IN); Timothy E. Graff, Arlington Heights, IL (US)

(73) Assignee: Appleton Grp LLC., Rosemont, IL (US)

( * ) Notice: Subject to any disclaimer, the term of this patent is extended or adjusted under 35 U.S.C. 154(b) by 162 days.

(21) Appl. No.: 15/465,815

(22) Filed: Mar. 22, 2017

(65) Prior Publication Data
US 2018/0002959 A1   Jan. 4, 2018

(30) Foreign Application Priority Data
Jun. 30, 2016   (IN) .............................. 201621022591

(51) Int. Cl.
*E05D 7/10* (2006.01)
*H05K 5/02* (2006.01)
(Continued)

(52) U.S. Cl.
CPC ............. *E05D 7/1061* (2013.01); *E05D 1/06* (2013.01); *E05D 3/022* (2013.01); *F21S 8/00* (2013.01); *F21V 27/02* (2013.01); *H02G 3/14* (2013.01); *H05K 5/0226* (2013.01); *E05Y 2900/60* (2013.01); *F21S 8/036* (2013.01); *F21V 17/107* (2013.01); *F21V 21/30* (2013.01); *F21V 23/00* (2013.01); *F21Y 2105/10* (2016.08); *F21Y 2115/10* (2016.08)

(58) Field of Classification Search
CPC ........... E05D 7/10–1022; E05D 7/1044–1083; E05D 2007/1027–1038; E05D 2007/1088; E05D 2007/1094; E05D 2007/0484; F21V 23/008; F21V 27/02; F21S 8/033; F21S 8/036; F21S 8/08; F21S 8/085–088; F16C 11/02; H02B 1/38; H01R 13/5213; H02G 3/088; H02G 3/14; H05K 5/0226
See application file for complete search history.

(56) References Cited

U.S. PATENT DOCUMENTS 3,710,419 A  * 1/1973  De Groft ............... E05D 7/105
                                                          16/257
9,494,301 B2   11/2016  Muchandi et al.
(Continued)

OTHER PUBLICATIONS

International Searching Authority, International Search Report dated Jun. 26, 2017, issued in connection with International Application No. PCT/US2017/023860, filed on Mar. 23, 2017, 10 pages.

*Primary Examiner* — Anh T Mai
*Assistant Examiner* — Steven Y Horikoshi
(74) *Attorney, Agent, or Firm* — McDonnell Boehnen Hulbert & Berghoff LLP (57) ABSTRACT

The present disclosure envisages a tool-less hinge mechanism for coupling a first element and a second element. The tool-less hinge mechanism comprises at least one lug integrally extending from one of the first element and the second element, and at least one loop integrally extending from remaining one of the first element and the second element. The at least one lug is configured to be received in the at least one loop, thereby providing hingeable coupling between the first element and the second element.

13 Claims, 10 Drawing Sheets

(51) Int. Cl.

*E05D 1/06* (2006.01)
  *F21V 27/02* (2006.01)
  *E05D 3/02* (2006.01)
  *F21S 8/00* (2006.01)
  *H02G 3/14* (2006.01)
  *F21Y 115/10* (2016.01)
  *F21V 17/10* (2006.01)
  *F21Y 105/10* (2016.01)
  *F21V 21/30* (2006.01)
  *F21V 23/00* (2015.01)

(56) References Cited

U.S. PATENT DOCUMENTS

| | | |
|---|---|---|
| 2003/0020841 A1 | 1/2003 | Takeda |
| 2010/0232155 A1* | 9/2010 | Wang ............... F21S 2/005 362/235 |
| 2011/0235343 A1* | 9/2011 | Arai ................ F21S 8/086 362/373 |
| 2012/0262917 A1* | 10/2012 | Courcelle ............ F21V 15/01 362/254 |
| 2014/0101890 A1* | 4/2014 | Ducharme ........... E05D 7/1083 16/254 |
| 2015/0131287 A1 | 5/2015 | Marsh et al. |
| 2016/0003455 A1 | 1/2016 | Muchandi et al. |
| 2016/0181048 A1 | 6/2016 | Whitaker et al. |
| 2016/0320035 A1* | 11/2016 | Duckworth ............ F21V 15/01 |

* cited by examiner

TOOL-LESS HINGE MECHANISM

FIELD

The present disclosure relates to the field of mechanical engineering. In particular, the present disclosure relates to the field of hinges.

BACKGROUND

A hinge is a jointed or a flexible device that facilitates the relative pivotal movement between two components, e.g., the pivotal movement of a door or a lid with respect to a stationary frame via a hinge. Conventionally, a hinge mechanism includes two brackets which are fastened to the two elements, which are to be pivotally coupled, by means of screws or other fasteners. A disadvantage of the conventional hinge mechanism is the high number of elements that the mechanism includes. Another disadvantage is that over a period of time, the fasteners are like screws are prone to loosening, thereby causing accidental disassembly of the components connected by the hinge mechanism. Further, the conventional hinge mechanism also involves the use of many different tools for fastening the brackets of the hinge mechanism onto the components to be coupled.

Hence, in order to overcome the aforementioned drawbacks, there is need for a tool-less hinge mechanism which does not involve the use of separate brackets and fasteners for connection with the components that need to be coupled via the tool-less hinge mechanism.

OBJECTS

Some of the objects of the present disclosure, which at least one embodiment herein satisfies, are as follows.

It is an object of the present disclosure to ameliorate one or more problems of the prior art or to at least provide a useful alternative.

An object of the present disclosure is to provide a tool-less hinge mechanism that does not involve the use of separate brackets and fasteners.

Another object of the present disclosure is to provide a tool-less hinge mechanism that has a simple tool-less operation.

Other objects and advantages of the present disclosure will be more apparent from the following description, which is not intended to limit the scope of the present disclosure.

SUMMARY

The present disclosure envisages a tool-less hinge mechanism for coupling a first element and a second element. The tool-less hinge mechanism comprises at least one lug integrally extending from one of the first element and the second element, and at least one loop integrally extending from remaining one of the first element and the second element. The at least one lug is configured to be received in the at least one loop, thereby providing hingeable coupling between the first element and the second element.

In an embodiment, the at least one lug has a first portion extending orthogonally from one of the first element and the second element, and a second portion extending orthogonally from the first portion.

In another embodiment, one of the at least one loop is an open loop having a U-shaped configuration with a chamfer configured on a free operative end of the at least one loop.

In another embodiment, the first element is a connection box coupled to an LED housing. The connection box has at least one aperture for receiving a current carrying cable for providing power to a driver for illuminating an LED array disposed within the LED housing.

In another embodiment, the second element is a cover that is hingeably coupled to the connection box using the tool-less hinge mechanism.

In another embodiment, the cover is fastened to the connection box by at least one captive screw proximal to the at least one loop having the U-shaped configuration, wherein the at least one captive screw prevents an accidental disassembly of the cover from the connection box when the cover is opened and suspended in a hanging configuration.

In another embodiment, the connection box and the cover are configured adjacent the LED housing operatively below the LED array, thereby providing a frontal access to the connection box and the cover and ensuring safe and easy installation thereof.

In another embodiment, a U-shaped configuration of the at least one loop facilitates the provision of uniform gasket squeeze to a gasket disposed operatively between the connection box and the cover.

BRIEF DESCRIPTION OF ACCOMPANYING DRAWING

A tool-less hinge mechanism of the present disclosure, will now be described with the help of the non-limiting accompanying drawing, in which.

DETAILED DESCRIPTION

Conventionally, a hinge mechanism includes two brackets which are fastened to the two elements, which are to be pivotally coupled, by means of screws or other fasteners. A disadvantage of the conventional hinge mechanism is the high number of elements that the mechanism includes. Another disadvantage is that over a period of time, the fasteners are like screws prone to loosening, thereby causing accidental disassembly of the components connected by the hinge mechanism. Further, the conventional hinge mechanism also involves the use of many different tools for fastening the brackets of the hinge mechanism onto the components to be coupled.

The present disclosure envisages a tool-less hinge mechanism for coupling a first element and a second element. The tool-less hinge mechanism of the present disclosure is integral with the elements that are to be coupled. As such, the tool-less hinge mechanism does not require the fastening of separate brackets onto the elements that are to be coupled. This eliminates the use of different tools for achieving the hingeable coupling between the elements.

Figure 1A:
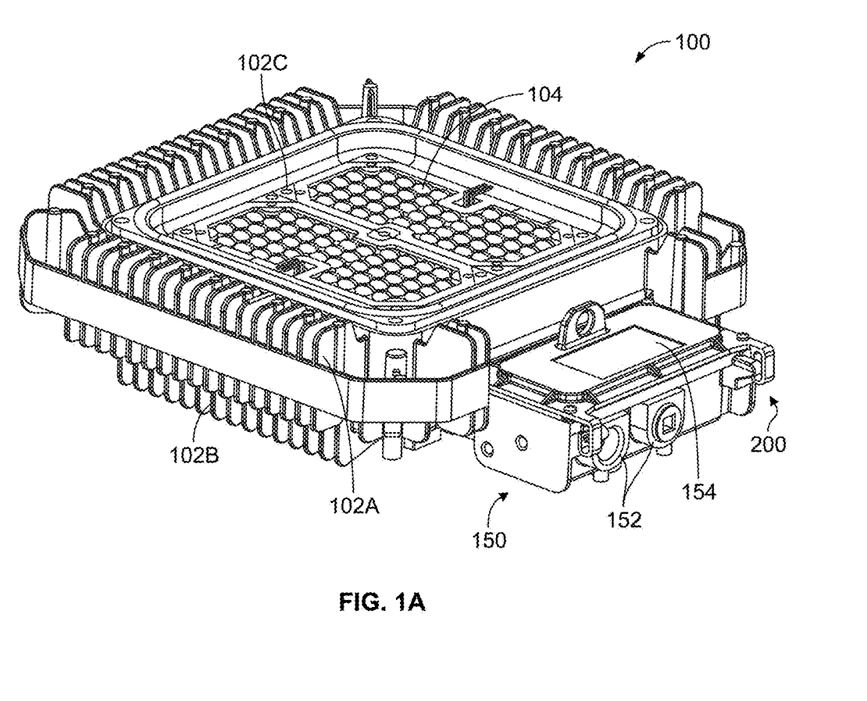
FIG. 1A and FIG. 1B illustrate isometric views of a LED housing with a connection box having the tool-less hinge mechanism configured thereon, in accordance with an embodiment of the present disclosure.
Figure 1B:
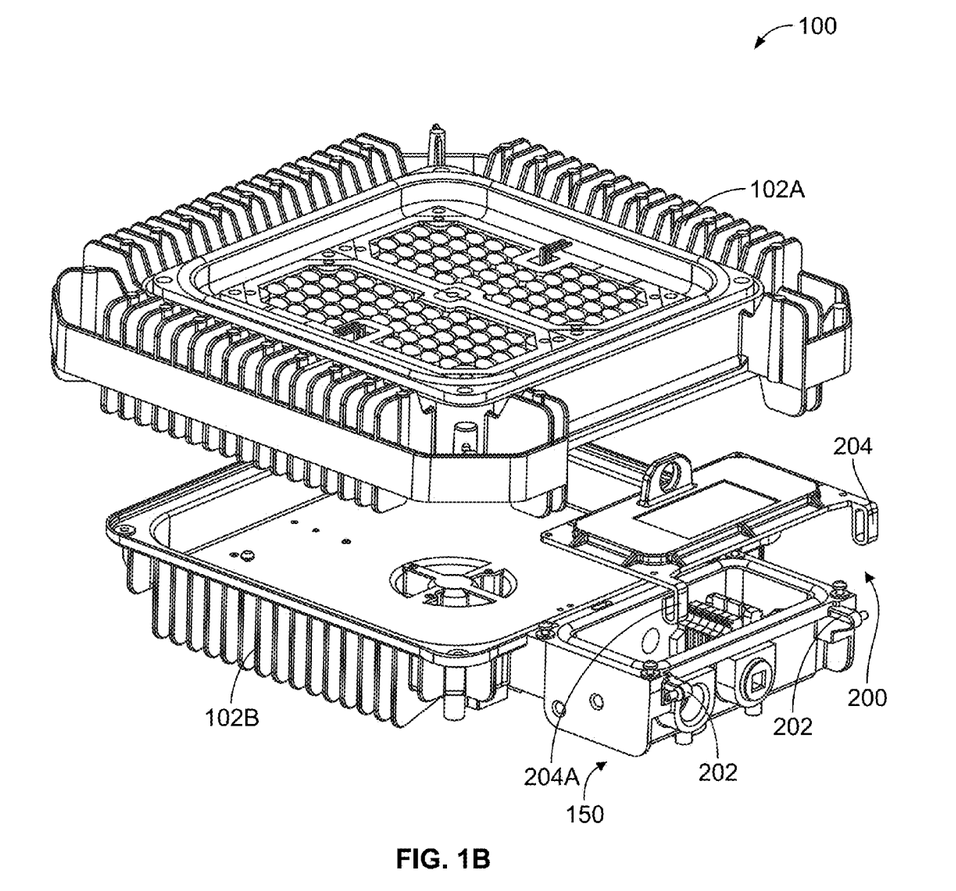

FIG. 1A and FIG. 1B illustrate isometric views of a LED housing 100 with a connection box 150 having a tool-less hinge mechanism 200 configured thereon. Reference is now given to FIG. 1A and FIG. 1B. The LED housing 100 comprises a first half 102A coupled with a second half 102B. The second half 102B has an opening configured thereon on which is received a lens plate 102C. More specifically, the LED housing 100 is defined by the first half 102A, the second half 102B, and the lens plate 102C. A space is configured within the LED housing 100 in which is disposed an LED matrix 104. As seen in FIG. 1A and FIG. 1B, the LED housing 100 is coupled to a connection box 150 (also referred to as a first element). The connection box 150 has apertures 152 configured thereon for receiving at least one cable. In an embodiment, each of the apertures 152 is configured to receive a current carrying cable for providing power to a driver (which is disposed within the LED housing 100) for illuminating the LED matrix 104 that is disposed within the LED housing 100. The connection box 150 is covered by means of a cover 154 (also referred to as a second element) which is hingeably coupled to the connection box 150 via the tool-less hinge mechanism 200 of the present disclosure.

Figure 2:
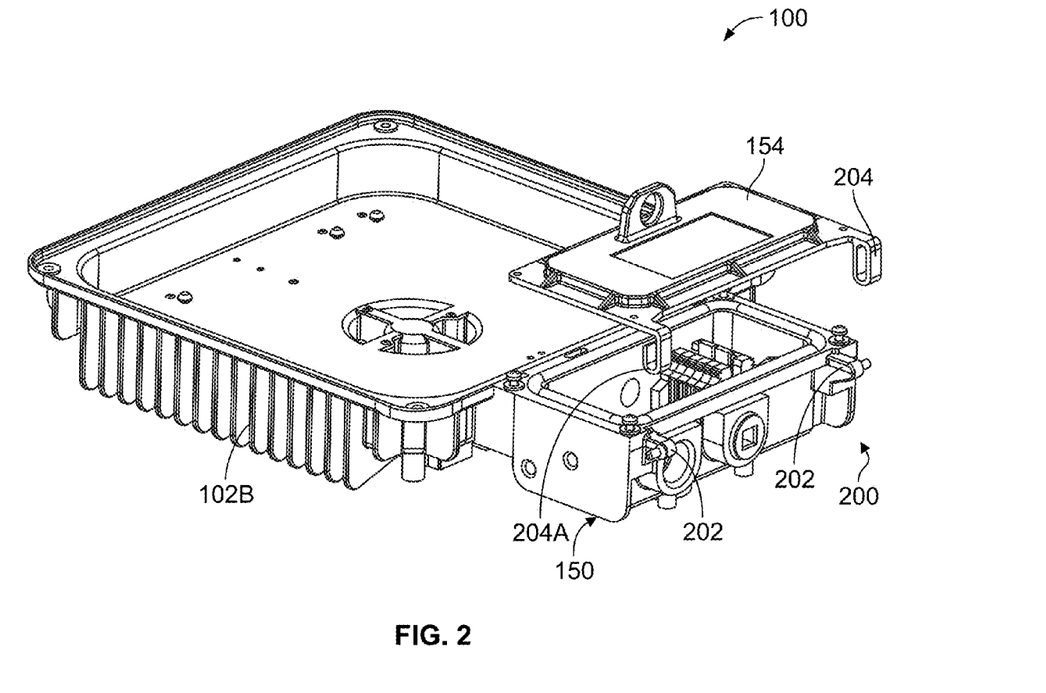
FIG. 2 illustrates an exploded isometric view of the LED housing of FIG. 1A, wherein a top half of the LED housing is not present.

In accordance with an embodiment of the present disclosure as seen in FIG. 2, the tool-less hinge mechanism 200 comprises at least one lug 202 integrally extending from the first element 150. The tool-less hinge mechanism also comprises at least one loop 204 integrally extending from the second element 154. The at least one lug 202 is configured to be received in the at least one loop 204, thereby providing hingeable coupling between the first element 150 and the second element 154.

Figure 3:
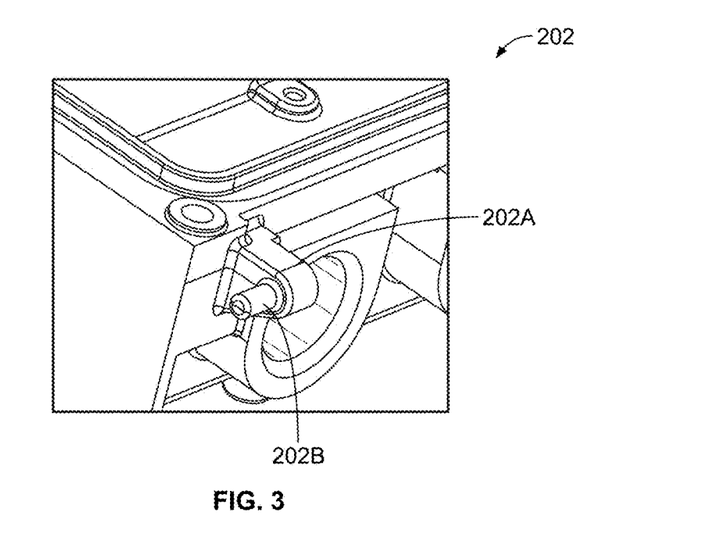
FIG. 3 illustrates an isometric view of a lug of the tool-less hinge mechanism.

In another embodiment, as clearly seen in FIG. 3, the at least one lug 202 has a first portion 202A extending orthogonally from the first element 150. A second portion 202B extends orthogonally from the first portion 202A. In another embodiment, the lug 202 can be configured on the second element 154 while the loops 204 and 204A are configured on the first element 150.

Figure 4:
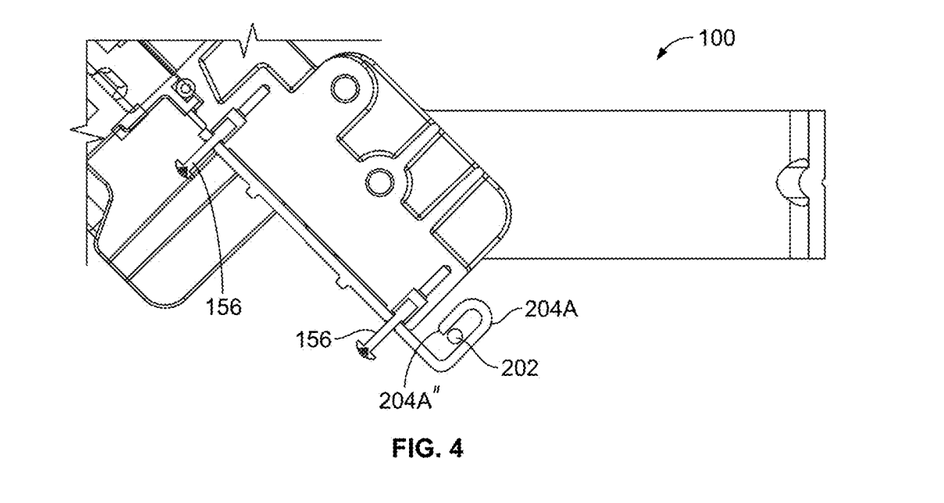
FIG. 4 illustrates a side view of the tool-less hinge mechanism, in which the captive screws used for fastening a cover of the connection box are seen.
Figure 5A:
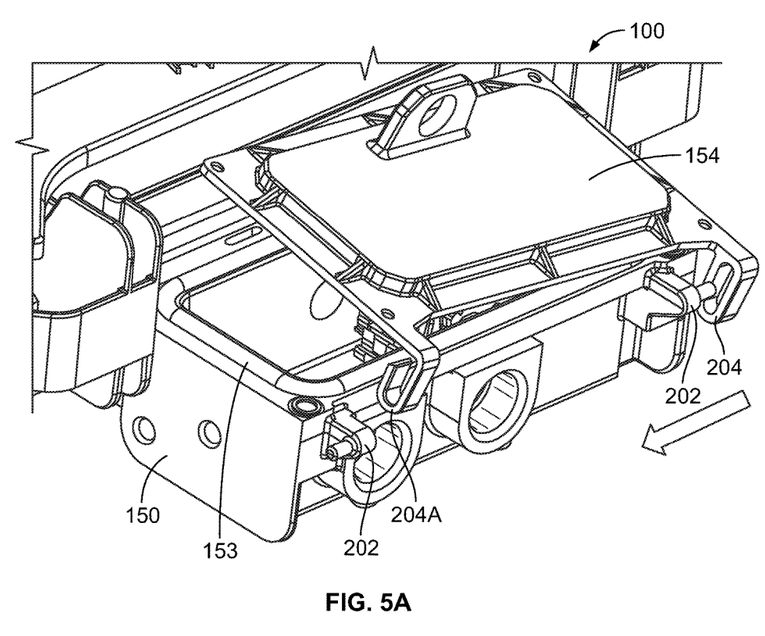
FIG. 5A-FIG. 5D illustrate isometric views of the steps involved in assembling the cover to the connection box using the tool-less hinge.
Figure 5B:
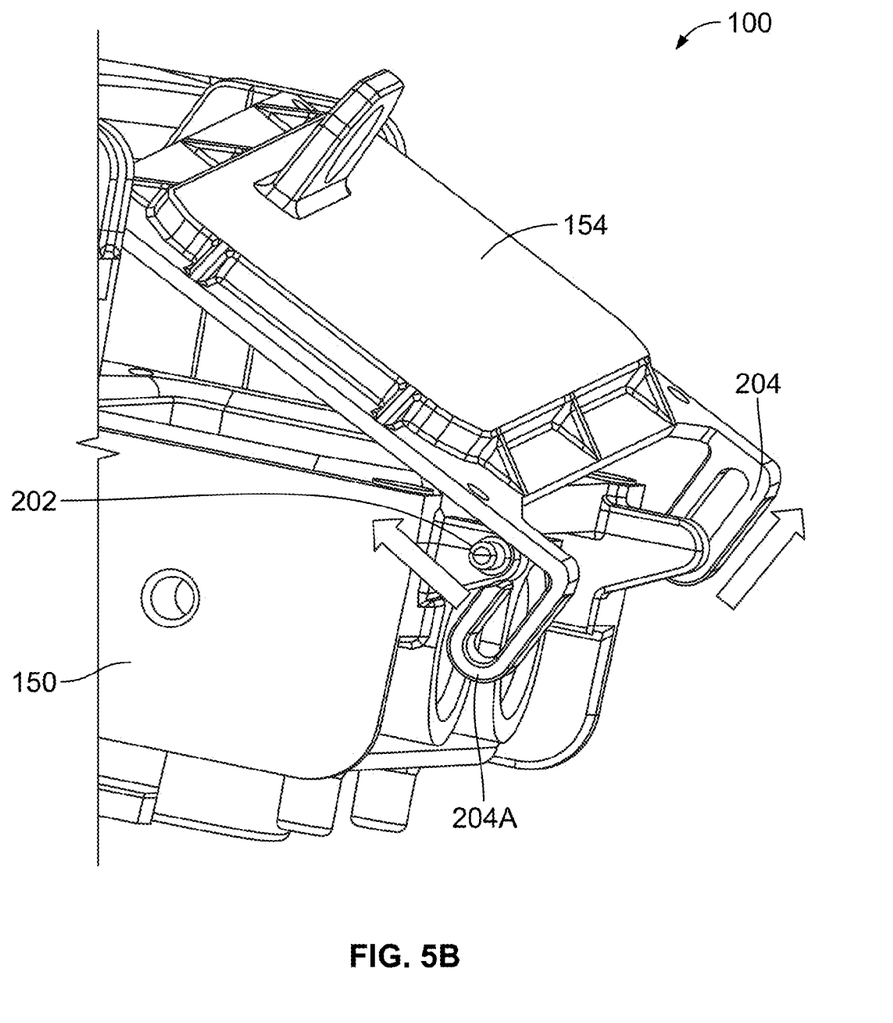
Figure 5C:
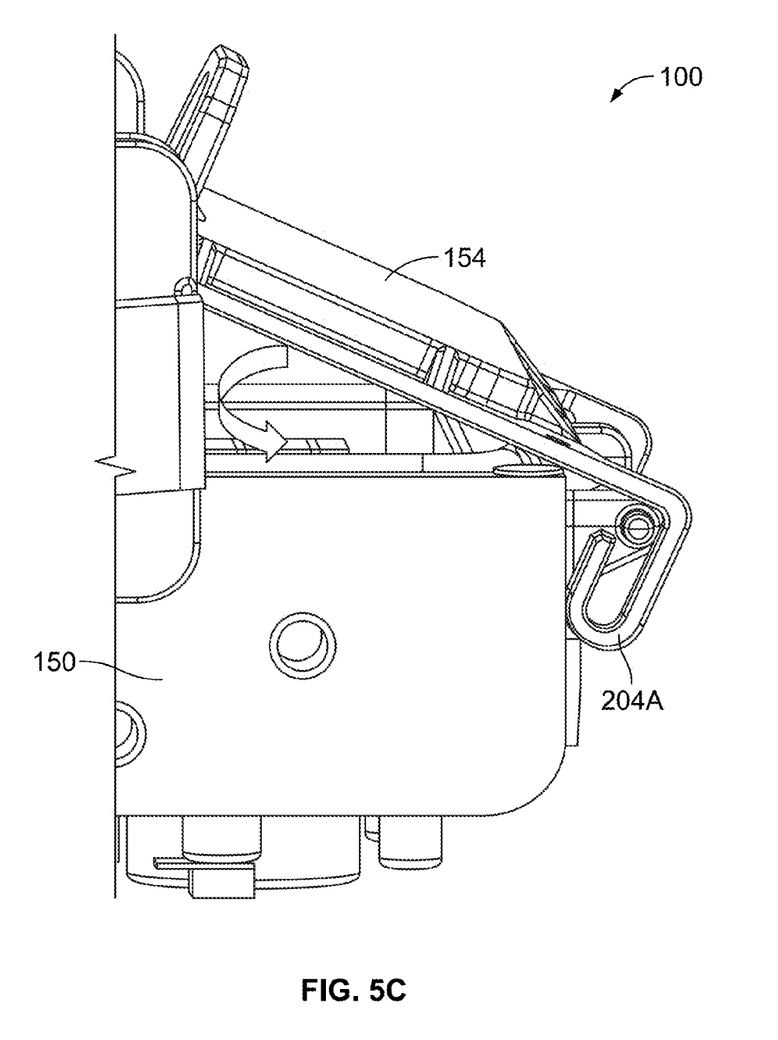
Figure 5D:
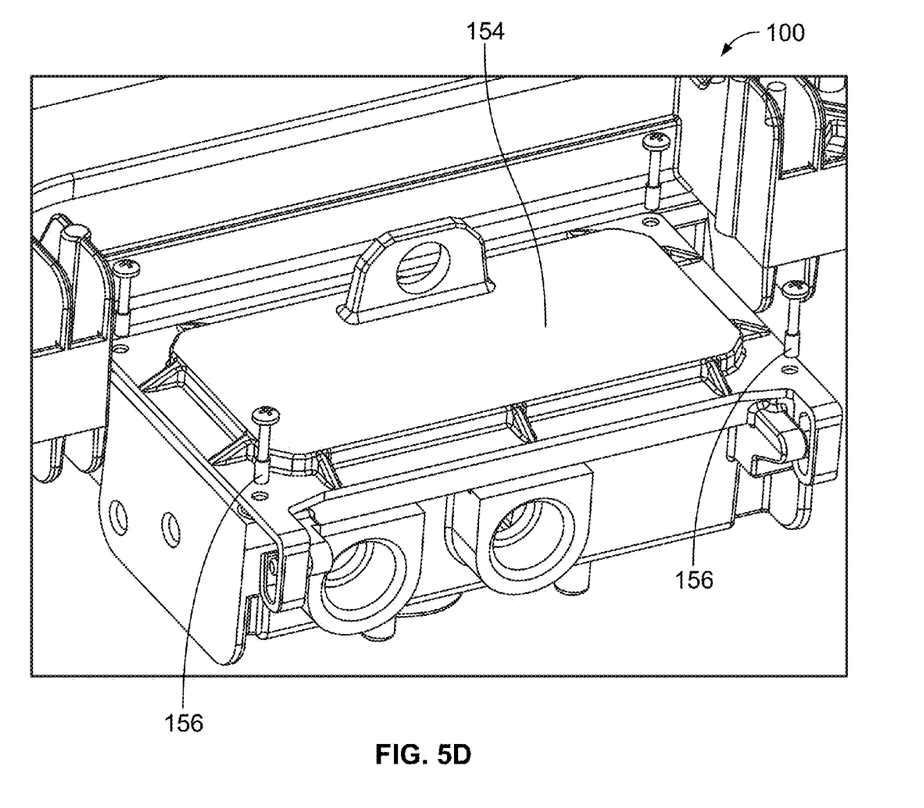

In another embodiment, as clearly seen in FIG. 4, one of the loops 204 is an open loop having a U-shaped configuration. In an exemplary embodiment, the closed loop 204 (previously referred to as loop 204) is made to engage with the lug 202, whereafter the open loop 204A, with a chamfer 204A" configured on a free operative end of the open loop, is received on the lug 202 corresponding to the open loop 204A. Having an open U-shaped configuration with the chamfer 204A", the open loop 204A facilitates an easy and fast assembly of the second element 154 onto the first element 150. A hingeable coupling is configured between the first element 150 and the second element 154 subsequent to the assembly of the loops 204 onto the lugs 202. As such, the second element 154, which is the cover, is hingeably coupled to the first element 150, which is the connection box, using the tool-less hinge mechanism 200 of the present disclosure.

In another embodiment, the second element 154 (cover) is further fastened to the first element 150 (connection box) by at least one captive screw 156. This fastening is in addition to the hingeable coupling between the first element 150 and the second element 154 to provide a secure covering to the first element 150. The use of the captive screw prevents an accidental disassembly of the second element 154 from the first element 150 when the second element 154 is opened and suspended in a hanging configuration.

Figure 6A:
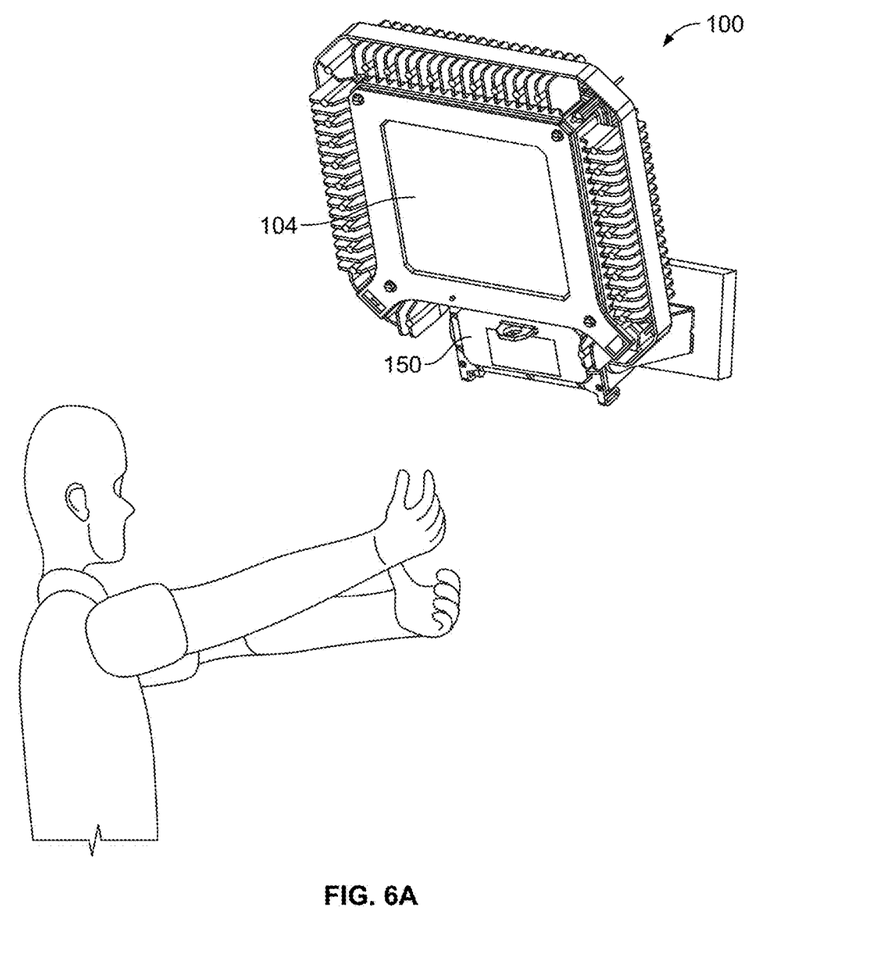
FIG. 6A illustrates an isometric view of the LED housing of FIG. 1A, depicting the ease of access to the connection box.
Figure 6B:
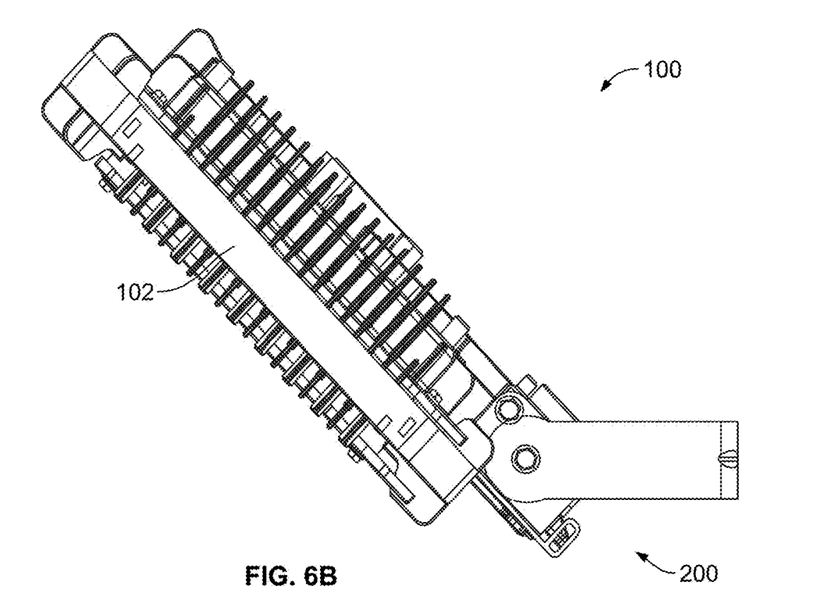
FIG. 6B illustrates a partial side view of the LED housing of FIG. 6A.
Figure 6C:
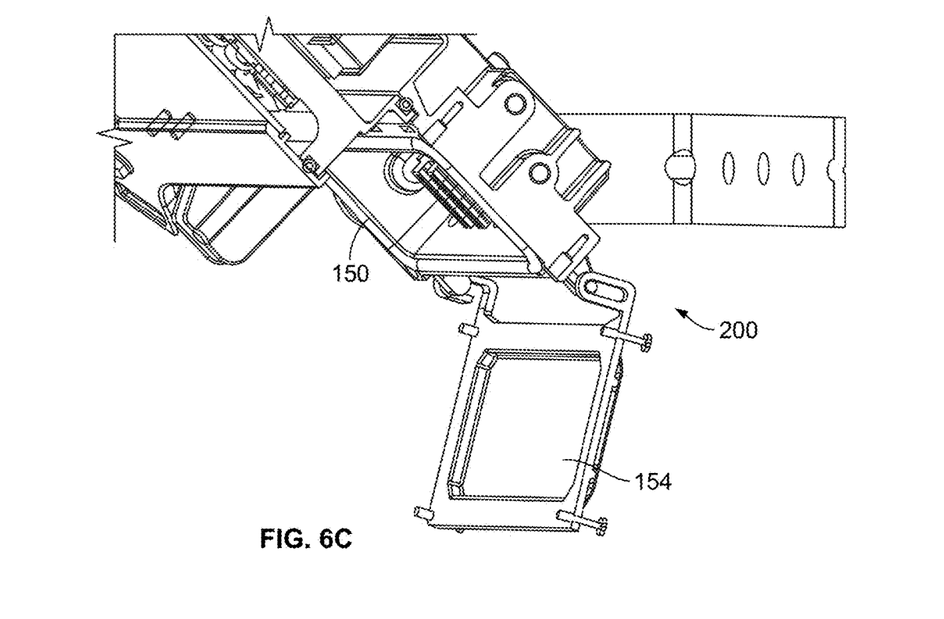
FIG. 6C illustrates an isometric view of the connection box of the LED housing of FIG. 6B.

FIG. 6A through FIG. 6C illustrate the different views of the LED housing 100 depicting the ease of access provided by the positioning of the connection box 150 adjacent an operative front side of the LED housing 100. More specifically, the connection box 150 is provided operatively below that face of the LED housing which emits the light rays, i.e., operatively below the LED array. Such a front accessible configuration is advantageous over the conventional lighting fixtures, as the human operator can perform field wiring with ease during installation. The front access also reduces the installation time associated with installation of the lighting fixtures. Furthermore, the use of the captive screws ensures that the cover 154 does not fall off from connection box 150 of the LED housing 100 during installation, thereby ensuring safe and easy installation.

FIG. 5A-FIG. 5D illustrate isometric views of the steps involved in assembling the cover 154 to the connection box 150 using the tool-less hinge 200. The first step in assembling the cover 154 to the connection box 150 involves engaging the loop 204, which has a closed configuration, onto the lug 202. The second step involves maneuvering the cover 154 such that the open loop 204A is received onto the lug 202. The third step involves maneuvering the cover 154 such that the cover 154 covers the connection box 150 in a closed configuration. The fourth step involves securing the cover 154 to the connection box 150 via the captive screws 156. It can also be appreciated that loops 204 and 204A allow for relative upward or downward movement between the first element 150 and the second element 154. As a result, the connection box can accommodate a gasket 153 of varying thickness to be positioned operatively between the cover 154 and first element 150.

Although, the tool-less hinge mechanism 200 has been described as establishing a hingeable coupling between a cover and a connection box of an LED housing, the application of the tool-less hinge mechanism 200 of the present disclosure is not limited by the exemplary application described in the present disclosure.

Technical Advances

The present disclosure described herein above has several technical advantages including, but not limited to, the realization of a tool-less hinge mechanism which:

does not involve the use of separate brackets and fasteners; and has a simple tool-less operation; and includes a cover that is coupled with the connection box via captive screws and the tool-less hinge mechanism, thereby ensuring safe and easy installation of the lighting fixtures.

The embodiments herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein.

Accordingly, the examples should not be construed as limiting the scope of the embodiments herein.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

We claim:

1. A tool-less hinge mechanism for coupling a first element and a second element, said tool-less hinge mechanism comprising:
    a first lug integrally extending from one of said first element and said second element, and a second lug integrally extending opposite said first lug from one of said first element and second element;
    a first loop having a vertically extending elongated slot, the first loop integrally extending from one of said first element and said second element, to which said first lug is not attached, wherein said first lug is configured to be received in said first loop, and a second loop having a vertically extending elongated slot, the second loop extending opposite of said first loop, wherein said second lug is configured to be received in said second loop thereby providing hingeable coupling between said first element and said second element; and wherein the vertically extending elongated slots positioned in the first and second loops allow for relative up and down movement of the first and second lugs within the vertically extending elongated slots to accommodate a gasket of varying thicknesses positioned between the first element and the second element.

2. The tool-less hinge mechanism as claimed in claim 1, wherein said first loop is an open loop having a U-shaped configuration with a chamfer configured on a free operative end of said first loop.

3. The tool-less hinge mechanism as claimed in claim 2, wherein said first element is a connection box coupled to a LED housing, said connection box having at least one aperture for receiving a current carrying cable for providing power to a driver for illuminating a LED array disposed within said LED housing.

4. The tool-less hinge mechanism as claimed in claim 2, wherein said second element is a cover and said first element is a connection box, where the cover is hingeably coupled to said connection box using said tool-less hinge mechanism.

5. The tool-less hinge mechanism as claimed in claim 2, wherein said second loop is a closed loop.

6. The tool-less hinge mechanism as claimed in claim 1, wherein said first element is a connection box coupled to a LED housing, said connection box having at least one aperture for receiving a current carrying cable for providing power to a driver for illuminating a LED array disposed within said LED housing.

7. The tool-less hinge mechanism as claimed in claim 6, wherein said second element is a cover and said first element is a connection box, where the cover is hingeably coupled to said connection box using said tool-less hinge mechanism.

8. The tool-less hinge mechanism as claimed in claim 1, wherein said second element is a cover and said first element is a connection box, and the cover is hingeably coupled to said connection box using said tool-less hinge mechanism.

9. The tool-less hinge mechanism as claimed in claim 8, wherein said cover is fastened to said connection box by at least one captive screw proximal to said first loop having a U-shaped configuration, wherein said first loop prevents an accidental disassembly of said cover from said connection box when said cover is opened and suspended in a hanging configuration.

10. The tool-less hinge mechanism as claimed in claim 8, wherein said connection box and said cover are configured adjacent said LED housing operatively below said LED array, thereby providing a frontal access to said connection box and said cover and ensuring safe and easy installation thereof.

11. The tool-less hinge mechanism as claimed in claim 8, wherein a gasket is disposed operatively between said connection box and said cover.

12. A tool-less hinge mechanism for coupling a first element and a second element, said tool-less hinge mechanism comprising:
    a first lug integrally extending from one of said first element and said second element, and a second lug integrally extending opposite said first lug from one of said first element and second element;
    a first loop having an elongated slot, the first loop integrally extending from one of said first element and said second element, to which said first lug is not attached, wherein said first lug is configured to be received in said first loop, and a second loop having an elongated slot, the second loop extending opposite of said first loop, wherein said second lug is configured to be received in said second loop thereby providing hingeable coupling between said first element and said second element;

wherein the first loop is an open loop having a U-shaped configuration, the elongated slot is positioned within the U-shaped configuration with an inwardly extending opening sized to allow the first lug to pass through the opening, and wherein the second loop having the elongated slot, wherein the elongated slots positioned in the first and second loops allow for relative up and down movement of the first and second lugs within the elongated slots to accommodate a gasket of varying thicknesses positioned between the first element and the second element.

13. The tool-less hinge mechanism as claimed in claim 12, wherein the first element is a cover and the second element is a connection box.

\* \* \* \* \*